(12) United States Patent
Seok et al.

(10) Patent No.: US 8,951,048 B2
(45) Date of Patent: Feb. 10, 2015

(54) PRINTED CIRCUIT BOARD HAVING TERMINALS

(71) Applicant: Samsung Electronics Co., Ltd., Suwon-si (KR)

(72) Inventors: Jong-Hyun Seok, Seoul (KR); Kyoung-Sun Kim, Uijeongbu-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 199 days.

(21) Appl. No.: 13/742,551

(22) Filed: Jan. 16, 2013

(65) Prior Publication Data

US 2013/0183839 A1 Jul. 18, 2013

(30) Foreign Application Priority Data

Jan. 16, 2012 (KR) .................... 10-2012-0004723

(51) Int. Cl.
*H01R 12/00* (2006.01)
*H05K 1/11* (2006.01)

(52) U.S. Cl.
CPC .......... *H05K 1/117* (2013.01); *H05K 2201/094* (2013.01); *H01L 2924/0002* (2013.01)
USPC .......................................... 439/59

(58) Field of Classification Search
CPC .. H01R 23/7005; H01R 23/684; H01R 23/70; H01R 13/6485; H01R 13/193; H01R 23/7073; H05K 1/117; H05K 1/118; H05K 2201/09709; H05K 2203/167
USPC .................... 439/951, 59, 924.1, 65; 361/760
See application file for complete search history.

(56) References Cited

U.S. PATENT DOCUMENTS

| | | | | | |
|---|---|---|---|---|---|
| 2,934,479 | A | * | 4/1960 | Deer | 205/125 |
| 2,959,758 | A | * | 11/1960 | Kehl et al. | 439/55 |
| 2,967,284 | A | * | 1/1961 | Bailey et al. | 439/59 |
| 3,205,471 | A | * | 9/1965 | Herrmann | 439/631 |
| 3,396,461 | A | * | 8/1968 | Spooner et al. | 29/827 |
| 3,605,061 | A | * | 9/1971 | Martin | 439/61 |
| 3,706,065 | A | * | 12/1972 | Knitter et al. | 439/79 |
| 3,765,076 | A | * | 10/1973 | Brandt | 29/860 |
| 4,361,955 | A | * | 12/1982 | Lancaster | 29/884 |

(Continued)

FOREIGN PATENT DOCUMENTS

| | | |
|---|---|---|
| KR | 1998-0045518 | 9/1998 |
| KR | 10-2002-0090047 | 11/2002 |

(Continued)

*Primary Examiner* — Amy Cohen Johnson
*Assistant Examiner* — Vladimir Imas
(74) *Attorney, Agent, or Firm* — Muir Patent Consulting, PLLC

(57) ABSTRACT

A printed circuit board (PCB) includes a substrate body including a circuit wiring layer; tap terminals provided at a surface of the substrate body and in a peripheral region of the substrate body and electrically connected to the circuit wiring layer; and plating wires corresponding to respective tap terminals, each plating wire extending from an end portion of its respective tap terminal toward an edge of the substrate body and having a line width smaller than a line width of the tap terminal. For at least a first tap terminal, the tap terminal shares an edge with an edge of its respective plating wire. A second tap terminal adjacent the first tap terminal is positioned outside a circle having a radius that equals a length of the plating wire and having a center at a point along the shared edge where the plating wire and first tap terminal connect.

20 Claims, 14 Drawing Sheets

(56) References Cited

U.S. PATENT DOCUMENTS

| | | | |
|---|---|---|---|
| 4,736,275 A * | 4/1988 | Kendall et al. | 361/767 |
| 4,845,313 A * | 7/1989 | Endoh et al. | 174/261 |
| 4,948,380 A * | 8/1990 | Dale | 439/395 |
| 5,319,523 A * | 6/1994 | Ganthier et al. | 361/753 |
| 5,525,763 A * | 6/1996 | Van Liere | 174/263 |
| 5,692,910 A * | 12/1997 | Mittal | 439/59 |
| 5,772,448 A * | 6/1998 | Ekrot et al. | 439/60 |
| 5,865,631 A * | 2/1999 | Berto et al. | 439/59 |
| 5,963,045 A * | 10/1999 | Zink et al. | 324/750.16 |
| 6,097,883 A * | 8/2000 | Dell et al. | 710/301 |
| 6,234,807 B1 * | 5/2001 | Amini et al. | 439/60 |
| 6,347,039 B1 * | 2/2002 | Lee | 361/760 |
| 6,658,530 B1 * | 12/2003 | Robertson et al. | 711/115 |
| 6,804,119 B2 * | 10/2004 | Ziemkowski | 361/715 |
| 6,899,546 B2 * | 5/2005 | Longueville et al. | 439/64 |
| 7,238,044 B2 * | 7/2007 | Uchida et al. | 439/492 |
| 7,245,503 B2 * | 7/2007 | Koga | 361/760 |
| 7,540,743 B2 * | 6/2009 | Park et al. | 439/65 |
| 7,569,773 B2 * | 8/2009 | Hu et al. | 174/117 FF |
| 7,857,657 B2 * | 12/2010 | Kuwahara et al. | 439/497 |
| 7,972,143 B2 * | 7/2011 | Smejtek | 439/61 |
| 8,131,903 B2 * | 3/2012 | Pearson et al. | 710/301 |
| 8,446,556 B2 * | 5/2013 | Kawamura et al. | 349/149 |
| 8,618,828 B2 * | 12/2013 | Ohsawa et al. | 324/763.01 |
| 8,677,043 B2 * | 3/2014 | Windell et al. | 710/301 |
| 2002/0063317 A1 * | 5/2002 | Hashimoto | 257/678 |
| 2002/0097367 A1 * | 7/2002 | Hirabayashi | 349/149 |
| 2006/0087218 A1 * | 4/2006 | Mikami et al. | 313/495 |
| 2009/0055567 A1 * | 2/2009 | Chen et al. | 710/302 |
| 2009/0084583 A1 * | 4/2009 | Ueno | 174/254 |
| 2009/0284928 A1 | 11/2009 | Eckberg et al. | |
| 2010/0210138 A1 * | 8/2010 | Kuwahara et al. | 439/607.01 |

FOREIGN PATENT DOCUMENTS

| | | |
|---|---|---|
| KR | 2006-0086296 | 7/2006 |
| KR | 10-2007-0048950 | 5/2007 |
| KR | 10-660878 | 12/2008 |

* cited by examiner

PRINTED CIRCUIT BOARD HAVING TERMINALS

PRIORITY STATEMENT

This application claims priority under 35 U.S.C. §119 to Korean Patent Application No. 10-2012-0004723, filed on Jan. 16, 2012 in the Korean Intellectual Property Office (KIPO), the entire contents of which are herein incorporated by reference.

BACKGROUND

Example embodiments relate to a printed circuit board (PCB) having external connection terminals. More particularly, example embodiments relate to a PCB for semiconductor module including a plurality of tap terminals.

A printed circuit board for semiconductor module may include tap terminals on one or more surfaces of a substrate, such as lower and upper surfaces. The tap terminals may be inserted into a socket to be electrically connected to electronic elements. Because the tap terminal is formed by an electroplating process, a plating wire having a thin width may remain to be connected to an end portion of the tap terminal.

Recently, as semiconductor devices have been highly integrated, the number of the tap terminals for transmitting signals has increased and a pitch between adjacent tap terminals has decreased. Accordingly, various shapes for tap terminals could be developed such that a short circuit of adjacent tap terminals due to external physical impacts may be prevented.

SUMMARY

Example embodiments provide a printed circuit board having high reliability.

According to one embodiment, a printed circuit board (PCB) is disclosed. The PCB includes a substrate body including a wiring pattern at a wiring pattern region of the substrate body; an outer connection region extending from the wiring pattern region to an edge of the substrate body, the outer connection region including a plurality of exposed external connection terminals; and at least a first exposed external connection terminal electrically connected to the wiring pattern and a second exposed external connection terminal electrically connected to the wiring pattern and adjacent to the first exposed external connection terminal. The first exposed external connection terminal includes, when viewed from a plan view, a first outer-most edge, a second outer-most edge connected to the first outer-most edge, a third outer-most edge opposite the first outer-most edge, a fourth outer-most edge opposite the second outer-most edge, and an additional edge. The third outer-most edge and the additional edge both face the edge of the substrate body. The second outer-most edge extends a distance d between a point where it intersects a line extending from the additional edge in the direction of the additional edge and a point where it intersects the third outer-most edge. The second exposed external connection terminal includes a fifth outer-most edge facing the second outer-most edge, and the second exposed external connection terminal is not formed in a circular region having a radius d and a center located on the second outer-most edge a distance d away from the third outer-most edge.

According to another embodiment, a printed circuit board (PCB) includes a substrate body including a wiring pattern at a wiring pattern region of the substrate body; an outer connection region extending from the wiring pattern region to an edge of the substrate body, the outer connection region including a plurality of exposed external connection terminals; and at least a first exposed external connection terminal electrically connected to the wiring pattern and a second exposed external connection terminal electrically connected to the wiring pattern and adjacent to the first exposed external connection terminal. The first exposed external connection terminal includes a first end portion that connects to a wiring of the wiring pattern, a second end portion opposite the first end portion and extending to the edge of the substrate body, and a middle portion between the first end portion and the second end portion. The second end portion includes a recessed portion having a recess on a first side of the first exposed external connection terminal and a finger portion having a finger on a second side of the first exposed external connection terminal opposite the first side. The second end portion includes at least four linear edges, at least a first edge of the linear edges including a shared edge shared with the middle portion of the first exposed external connection terminal, and at least a second edge of the linear edges perpendicular to the first edge.

In one embodiment, a printed circuit board (PCB) includes a substrate body including a circuit wiring layer; tap terminals provided at a surface of the substrate body and in a peripheral region of the substrate body and electrically connected to the circuit wiring layer; and plating wires corresponding to respective tap terminals, each plating wire extending from an end portion of its respective tap terminal toward an edge of the substrate body and having a line width smaller than a line width of the tap terminal. For at least a first tap terminal, the tap terminal shares an edge with an edge of its respective plating wire. A second tap terminal adjacent the first tap terminal is positioned outside a circle having a radius that equals a length of the plating wire and having a center at a point along the shared edge where the plating wire and first tap terminal connect.

According to example embodiments, a printed circuit board (PCB) for semiconductor module includes a substrate body including a circuit wiring layer. Tap terminals are provided on lower and upper surfaces of the substrate body and in a peripheral region of the substrate body and electrically connected to the circuit wiring layer. Plating wires extend from each of end portions of the tap terminals to an edge of the substrate body and have a line width smaller than a line width of the tap terminal. The tap terminal is positioned outside a circle having a length of the plating wire from the portion of the adjacent tap terminal from which the plating wire protrudes.

In example embodiments, the tap terminal may include a recessed portion at a position near the portion of the adjacent tap terminal from which the plating wire protrudes.

In example embodiments, the recessed portion of the tap terminal may have an oblique side shape, an arc shape or a stepped shape.

In example embodiments, the tap terminal may have one right angle in a vertex portion adjacent to the edge of the substrate body and the plating wire may extend from the vertex portion of the tap terminal.

In example embodiments, the tap terminal may have three right angles in vertex portions thereof.

In example embodiments, the tap terminal may have a rectangular shape and the plating wire may extend from the middle portion of a side of the tap terminal adjacent to the edge of the substrate body.

In example embodiments, a side of the tap terminal adjacent to the edge of the substrate body may extend obliquely with respect to the edge of the substrate body such that a line width of the tap terminal decreases gradually toward the edge of the substrate body.

In example embodiments, the width of the portion of the tap terminal adjacent to the edge of the substrate body may be substantially identical to the width of the plating wire.

According to example embodiments, a printed circuit board (PCB) for semiconductor module includes a substrate body including a circuit wiring layer. First tap terminals are provided in a peripheral region of the substrate body to serve as a signal terminal for applying a signal. First plating wires extend from each of end portions of the first tap terminals to an edge of the substrate body and have a line width smaller than a line width of the first tap terminal. Second tap terminals are provided between the first tap terminals to serve as a ground terminal or a power terminal for applying a ground signal or a power signal. The second tap terminal is farther away from the edge of the substrate body than the first tap terminal.

In example embodiments, the circuit wiring layer of the substrate body may include a ground layer for receiving a ground signal, a power layer for receiving a power signal and a signal wiring layer including wiring patterns.

In example embodiments, the second tap terminal may be electrically connected to the ground layer or the power layer through a via.

In example embodiments, the PCB for semiconductor module may further include third tap terminals and second plating wires that are provided to allow current to flow through the second tap terminals via the ground layer or the power layer.

In example embodiments, the second tap terminal may be positioned outside a circle having a length of the first plating wire from the portion of the adjacent first tap terminal from which the first plating wire protrudes.

In example embodiments, the first and second tap terminals may have a rectangular shape.

According to example embodiments, a printed circuit board (PCB) for semiconductor module includes a substrate body including a circuit wiring layer. Tap terminals are provided in a peripheral region of the substrate body to extend to an edge of the substrate body, electrically connected to the circuit wiring layer and have three right angles in vertex portions thereof. A side of the tap terminal adjacent to the edge of the substrate body extends obliquely with respect to the edge of the substrate body such that a line width of the tap terminal decreases gradually toward the edge of the substrate body According to example embodiments, even though the plating wire is damaged in use, a short circuit of the adjacent tap terminals may be prevented, to thereby provide a PCB for semiconductor module having high reliability.

BRIEF DESCRIPTION OF THE DRAWINGS

Example embodiments will be more clearly understood from the following detailed description taken in conjunction with the accompanying drawings. FIGS. 1 to 10C represent non-limiting, example embodiments as described herein.

FIG. 1 is a plan view illustrating a printed circuit board for semiconductor module in accordance with a first example embodiment.

FIG. 9 is a plan view illustrating a set of exemplary tap terminals for the printed circuit board, according to certain embodiments.

FIGS. 10A to 10C are plan views illustrating an exemplary method of manufacturing the printed circuit board for semiconductor module in FIG. 8A.

DETAILED DESCRIPTION OF EXAMPLE EMBODIMENTS

Figure 1:
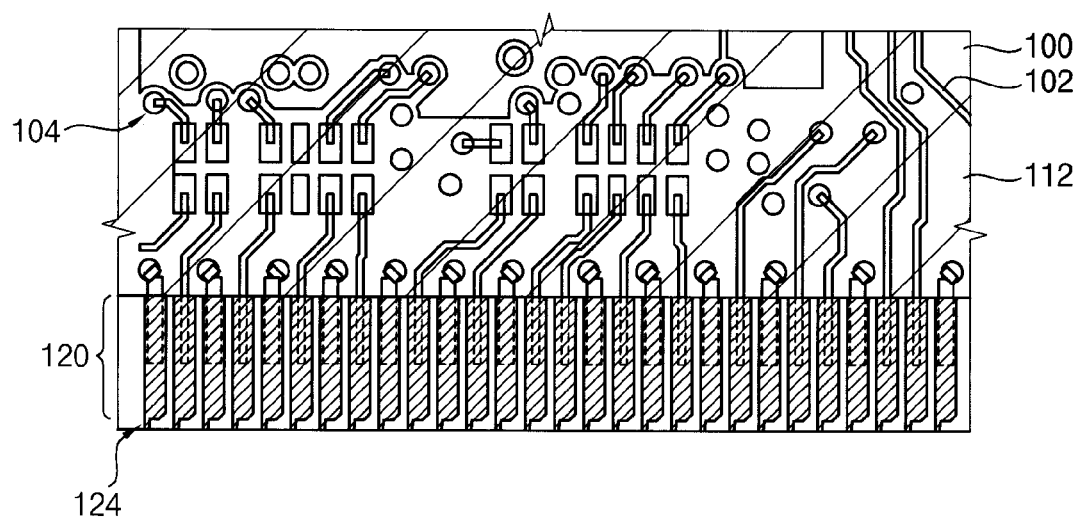

Various example embodiments will be described more fully hereinafter with reference to the accompanying drawings, in which example embodiments are shown. Example embodiments may, however, be embodied in many different forms and should not be construed as limited to example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper," "top," "bottom," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to plan views and cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, a linear feature, when viewed at a microscopic level or due to slight manufacturing discrepancies may have jagged, rounded, or curved features rather than an exact straight line. Thus, the regions illustrated in the figures are schematic in nature and their shapes are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2A:
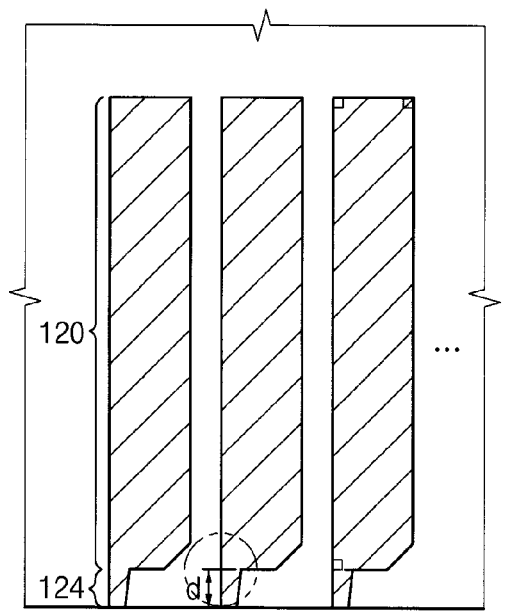
FIG. 2A is a plan view illustrating a tap terminal of the printed circuit board for semiconductor module in FIG. 1.

FIG. 1 is a plan view illustrating a printed circuit board in accordance with a first example embodiment. FIG. 2A is a plan view illustrating external connection terminals of the printed circuit board for semiconductor module in FIG. 1.

Referring to FIGS. 1 and 2A, a printed circuit board for semiconductor module according to one embodiment may include a substrate body 100 having a circuit wiring layer, a tap terminal 120 and a plating wire 124.

Figure 8A:
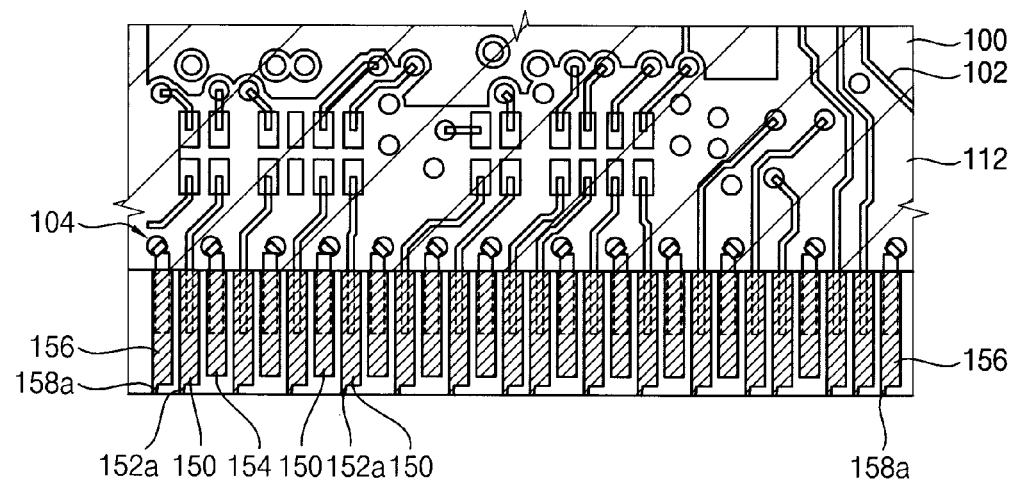
FIG. 8A is a plan view illustrating a printed circuit board for semiconductor module in accordance with a further example embodiment.
Figure 8B:
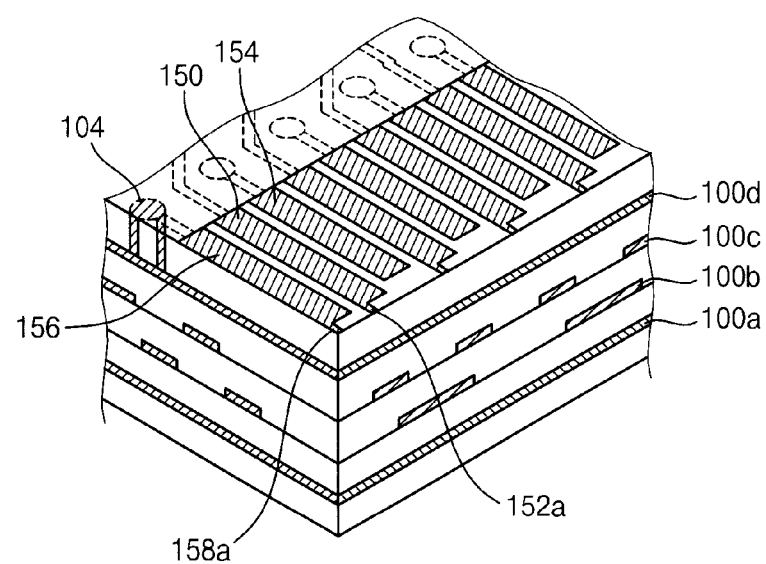
FIG. 8B is a perspective view illustrating a printed circuit board for a semiconductor module, according to certain embodiments.

The circuit wiring layer of the substrate body 100 may include a ground layer, a power layer, and a signal wiring layer (e.g., layers 100a, 100b and 100c as shown in FIG. 8B). Wiring patterns 102 and vias 104 may be provided on a surface of the substrate body.

A plurality of the tap terminals 120 may be provided on one or more surfaces, such as lower and upper surfaces, of the substrate body. The tap terminals 120 may be provided in a peripheral region of the substrate body. The tap terminal 120 may be electrically connected to the wiring pattern 102 and a via 104.

The printed circuit board may be used for semiconductor module. As such, the printed circuit board can be inserted into a socket (not illustrated) so that the tap terminal 120 makes contact with an input/output terminal of the socket. As a result, external electrical signal may be inputted/outputted to/from the wiring patterns, the ground layer and the power layer through the tap terminal 120.

Hereinafter, exemplary shapes of the tap terminal and the plating wiring will be explained when viewed from plan view.

Referring to FIG. 2A, a tap terminal 120 according to one embodiment may have three right angles. The tap terminal 120 may have two right angles in a portion opposite to an edge of the substrate body 100 and one right angle in a portion adjacent to the edge of the substrate body 100.

The plating wire 124 may be connected to the portion of the tap terminal 120 adjacent to the edge of the substrate body 100 having one right angle, and may extend toward an edge portion of the substrate body 100. As such, the plating wire 124 may have a shape extruding from the end portion of the tap terminal 120. The plating wire 124 may have a line width smaller than a line width of the tap terminal 120. An end portion of the plating wire 124 connected to the tap terminal 120 may have a width smaller than that of the other portion of the plating wire 124. As illustrated in the figure, a lateral side of the plating wire 124 may extend obliquely inward from the edge portion of the substrate body 100, so that the plating wire 124 has a tapered structure. However, the lateral side of the plating wire 124 may also be parallel to an edge of the plating wire that also forms an edge of the tap terminal.

The plating wire 124 and the tap terminal 120 may be formed, for example, by an electroplating process. The plating wire 124 and the tap terminal 120 may include one or more conductive materials such as metals. In one embodiment, the plating wire 124 and the tap terminal 120 are formed of nickel and gold. Accordingly, the plating wire 124 and the tap terminal 120 may be formed of a metal having a low resistance.

In a manufacture of a printed circuit board for a semiconductor module, a router process may be performed to divide a flat substrate into a respective printed circuit board. An electroplating process may be performed using the plating wire 124 as an electrode. Then, a router process may be performed on the flat substrate to form the plating wire 124.

In particular, when the flat substrate is divided by a router process, a plating wire such as an electrode may be cut together to form the plating wire 124. Accordingly, when the line width of the plating wire 124 is very great, it may be difficult to perform a router process so that damages to the plating wire 124 and the tap terminal 120 may occurs. Thus, a plating wire 124 at a point where a cutting process occurs should have a line width smaller than that of the tap terminal 120 to avoid such damages.

In the embodiment depicted in FIG. 2A, the plating wire 124 may protrude from the tap terminal 120 by a first distance (d). As such, the plating wire 124 may have a length of a first distance (d). The tap terminals 120 may be spaced apart from each other by a distance smaller than the first distance (d).

The tap terminal 120 may have a recessed portion at a position near the vertex portion of the adjacent tap terminal 120 forming the right angle such that the recessed portion of the tap terminal 120 is not positioned within a circle having the first distance (d) from the vertex portion of the adjacent tap terminal 120. Stated differently, where two tap terminals are formed adjacent to each other, for at least a first tap terminal, the tap terminal may share an edge with an edge of its respective plating wire (e.g., the left edge as shown in FIG. 2A). The second tap terminal adjacent the first tap terminal may have a recessed portion adjacent the plating wire of the first tap terminal, such that the material of the second tap terminal is positioned outside a circle having a radius that equals a length of the plating wire and having a center at a point along the shared edge where the plating wire and first tap terminal connect.

The recessed portion of the tap terminal 120 may have various shapes. As illustrated in FIG. 2A, the recessed portion of the tap terminal 120 may have an oblique side.

Figure 2B:
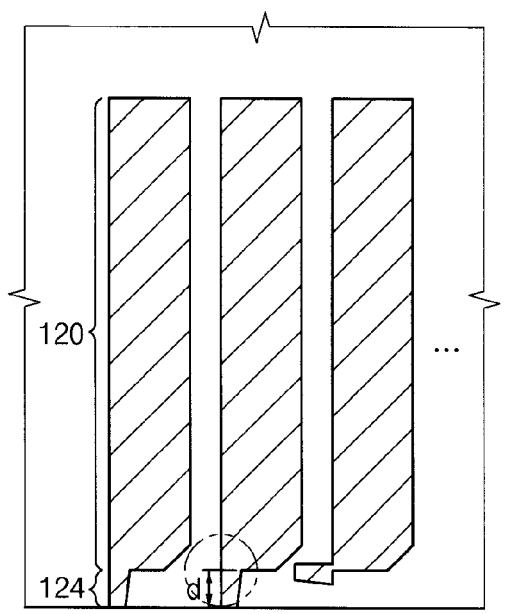
FIG. 2B shows that the plating wire in FIG. 2A is damaged.

FIG. 2B shows that the plating wire in FIG. 2A is damaged.

As illustrated in FIG. 2B, the plating wire 124 may have a relatively small line width, and thus, the plating wire 124 may be damaged and bent by external physical impacts to move laterally. Accordingly, in a conventional system, the bent portion of the plating wire 124 may be electrically connected to the adjacent tap terminal 120, causing a short circuit.

However, according to the present embodiment, the tap terminal 120 may have a recessed portion at a position near the vertex portion of the adjacent tap terminal 120 forming the right angle such that the recessed portion of the tap terminal 120 is not positioned within a circle having the first distance (d) from the vertex portion of the adjacent tap terminal 120. Accordingly, even though the plating wire 124 may be damaged and bent to move laterally, the adjacent tap terminals 120 may be prevented from being electrically connected to each other.

Figure 2C:
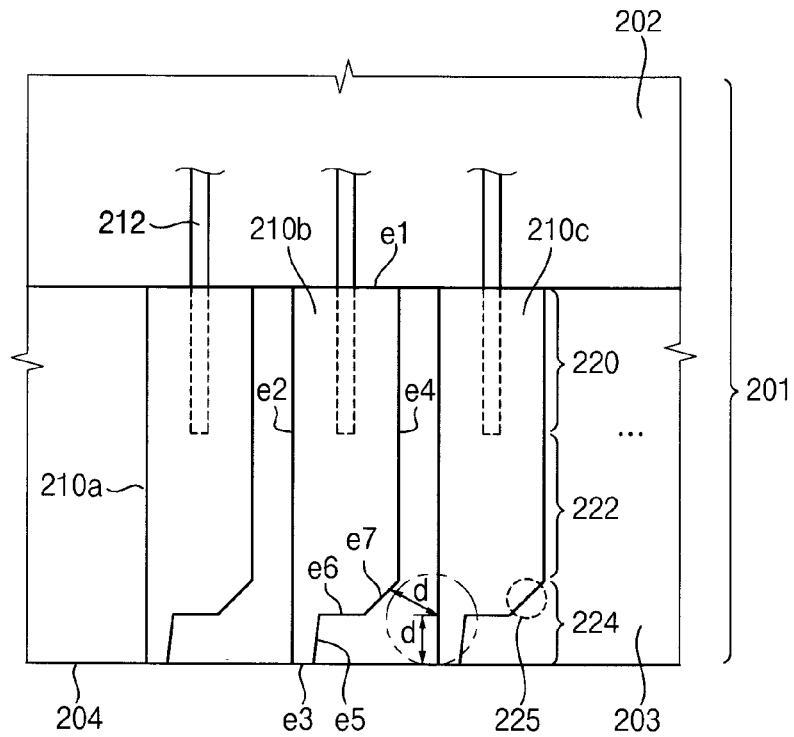
FIG. 2C is a plan view illustrating a further description of external connection terminals on a printed circuit board, according to certain embodiments.
Figure 2D:
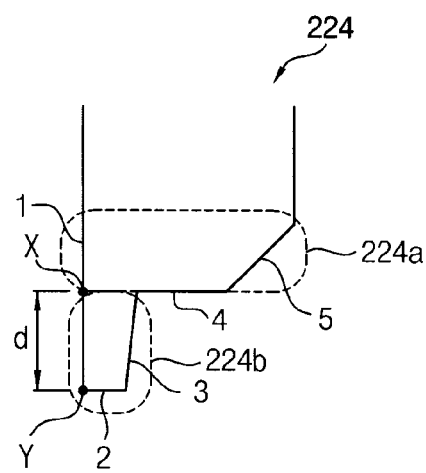
FIG. 2D is a close-up view of the plan view of FIG. 2C, according to certain embodiments.

FIG. 2C is a plan view showing a PCB having external connection terminals, consistent with certain embodiments, and FIG. 2D is a plan view showing an enlarged view of an end portion of an external connection terminal shown in FIG. 2C.

The external connection terminals 210a, 210b, and 210c shown in FIG. 2C may be formed from a conductive plating material, and may be disposed on a surface of the PCB. The PCB may include a substrate body 201 that includes a wiring pattern region 202 that includes a wiring pattern 212, and an outer connection region 203 that includes the external connection terminals 210a, 210b, and 210c. The wiring pattern 212 may include wires and terminals that connect to internal circuits on one or more chips or chip packages mounted on the PCB. In some embodiments, an insulating material may cover the wiring pattern region 202 to protect it from the outside. The insulating material may be omitted from at least part of the outer connection region 203, so that the external connection terminals 210a, 210b, and 210c are exposed to the outside. Although described differently, the external connection terminals 210a, 210b, and 210c may have the same shape and construction as the structures shown in FIG. 2A. The descriptive terms of terminals 210a, 210b, and 210c in connection with FIGS. 2C and 2D below, where applicable, may also apply to the embodiments shown in FIGS. 3A, 3B, 5A, 5B, and 9.

Figure 9:
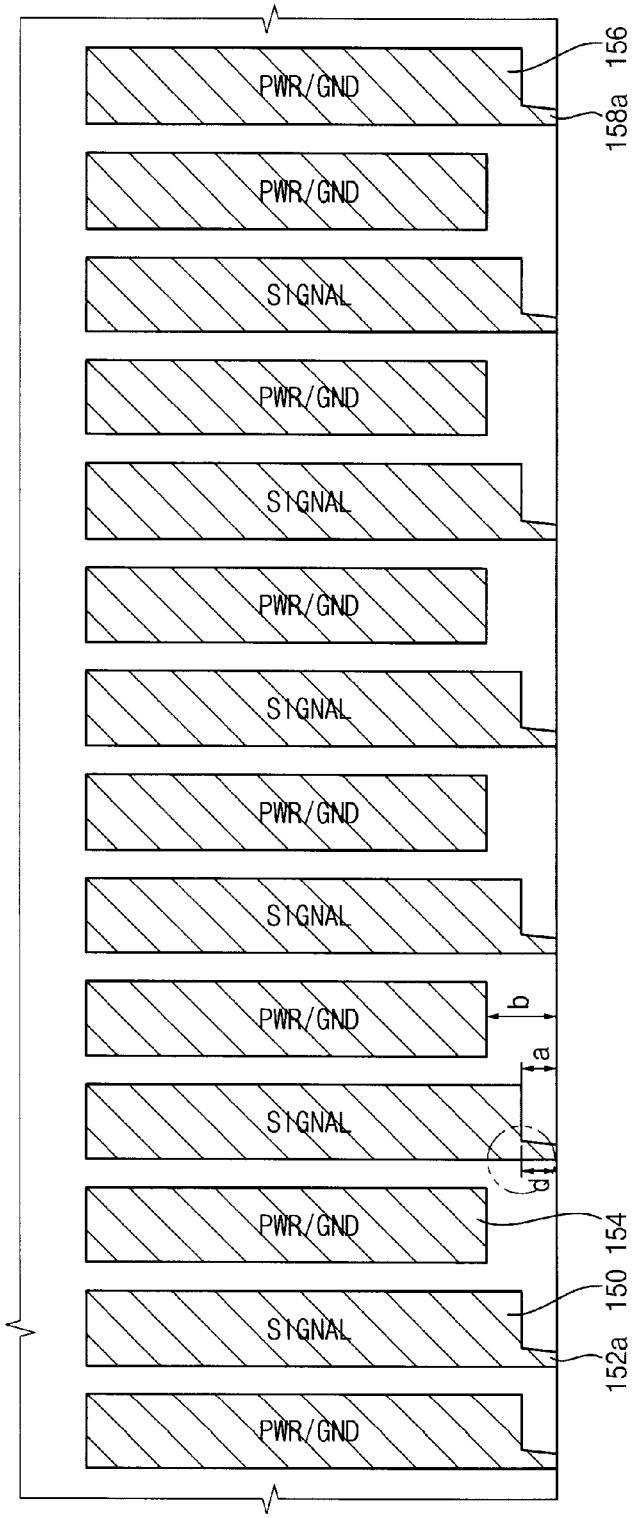

As shown in FIG. 2C, an outer connection region 203 of the substrate body 201 may extend from the wiring pattern region 202 to an edge of the substrate body 204. One or more of the external connection terminals 210a, 210b, and 210c may connect to a wire of the wiring pattern 212. For example, the external connection terminals 210a, 210b, and 210c may each include a conductive plating material that covers and contacts a wire to electrically connect to the wiring pattern 212. In certain embodiments, certain adjacent terminals of the external connection terminals 210a, 210b, and 210c may have the same shape and size. However, in some embodiments, such as shown in FIG. 9, certain adjacent external connection terminals have different shapes and/or sizes.

For the purposes of discussion, an exemplary first external connection terminal 210b and an adjacent second connection terminal 210c are discussed in detail. Both terminals 210b and 210c in FIG. 2C are depicted as having the same structure, and the labels shown for terminal 210b apply to terminal 210c and vice versa. As shown in FIG. 2C, the first external connection terminal 210c includes, when viewed from a plan view, a first outer-most edge (e.g., e1), a second outer-most edge (e.g., e2) connected to the first outer-most edge, a third outer-most edge (e.g., e3) opposite the first outer-most edge, a fourth outer-most edge (e.g., e4) opposite the second outer-most edge, and at least one additional edge (e.g., e5, e6, or e7). In one embodiment, the third outer-most edge and the additional edge (e.g., e6 or e7) both face the edge 204 of the substrate body. The outer-most edges refers edges closest to the outside of the terminal—for example, edges closest to an edge of the substrate body 201, edges closest to the wiring pattern region 202, and edges closest to the outer-most sides of the external connection terminals.

In one embodiment, as shown for example in FIG. 2C, when viewed from a plan view, the first outer-most edge (e.g., e1) is a top-most edge, the third outer-most edge (e.g., e3) is a bottom-most edge, the second outer-most edge (e.g., e2) is one of a right-most edge and a left-most edge (e.g., a left-most edge in FIG. 2C), and the fourth outer-most edge (e.g., e4) is the other of a right-most edge and a left-most edge (e.g., a right-most edge in FIG. 2C).

Figure 3A:
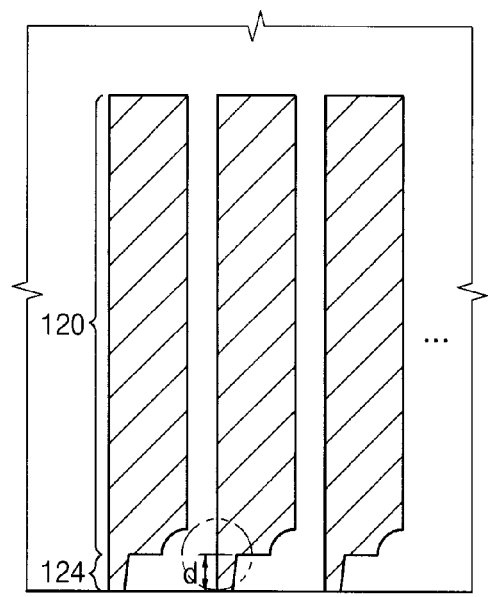
FIGS. 3A and 3B are plan views illustrating a tap terminal of a printed circuit board for semiconductor module according to modified embodiments.
Figure 5A:
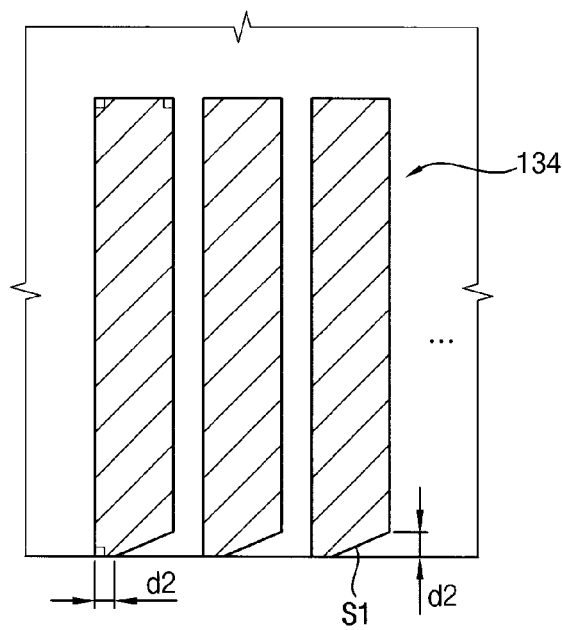
FIG. 5A is a plan view illustrating a tap terminal of a printed circuit board for semiconductor module in accordance with another example embodiment.

In certain embodiments, as shown for example in at least FIGS. 2A-2C, 3A, 3B, 5B, and 9, the first through fourth outer-most edges (e.g., e1-e4) and the additional edge (e.g., e6) are linear edges, and the third outer-most edge (e.g., e3) is parallel to the additional edge (e.g., e6). As shown for example in FIGS. 2C and 2D, the first exposed external terminal may include an oblique edge (e.g., e7). The oblique edge may extend between the additional edge (e.g., e6) and the fourth outer-most edge (e.g., e4). In one embodiment, the second outer-most edge (e.g., e2) and fourth outer-most edge (e.g., e4) are parallel to each other and are perpendicular to the first outer-most edge (e.g., e1). In one embodiment, the third outer-most edge is parallel to the first outer-most edge and to the additional edge. In another embodiment, such as shown in FIG. 5A, the additional edge is an oblique edge extending between the third outer-most edge and the fourth outer-most edge. The edges of the external connection terminals 210a, 210b, and 210c may be linear edges, such as shown in FIGS. 2C and 2D. However, in other embodiments, such as shown in FIG. 3A, one or more edges of the external connection terminals 210a, 210b, and 210c may be curved.

In one embodiment, as shown for example in FIGS. 2C and 2D, the second outer-most edge (e.g., e2) extends a distance d between a point where it intersects a line extending from the additional edge in the direction of the additional edge (e.g., point X) and a point (e.g., point Y) where it intersects the third outer-most edge (e.g., e3).

The second external connection terminal 210b includes a fifth outer-most edge (e.g., edge e4 of terminal 210b) facing the second outer-most edge (e.g., e2) of the first external connection terminal 210c. For example, the two edges may be parallel to each other. In one embodiment, the second external connection terminal 210b is formed such that it is not formed in a circular region having a radius d and a center located on the second outer-most edge (e.g., e2) a distance d away from the third outer-most edge (e.g., e3). For example, the second external connection terminal 210b may have a recessed portion 225 so that it is not formed in the circular region.

Described in a different way, the external connection terminals 210a, 210b, and 210c may each include three portions. A first portion 220 may be a first end portion that connects to a wiring of the wiring pattern. A second portion 224 may be a second end portion opposite the first end portion 220. For example, the second portion 224 may extend to an edge of the substrate body 201. A third portion 222 may be a middle portion disposed between and connecting the first end portion 220 and the second end portion 224. The first end portion 220, second end portion 222, and third portion 224 may include the edges (e.g., e1-e7) such as described above.

In one embodiment, the second end portion 224 includes two sub-portions, recessed portion 224a, and finger portion 224b. The recessed portion 224a may have a recess (e.g., 225) where, for example, a corner portion is removed. The recess (e.g., 225) may be large enough to allow for the circular region described above. The recess (e.g. 225) may be on a first side of an external connection terminal. The finger portion 224b may include a finger that includes plating material that extends past the recessed region. The finger may be on a second side of the external connection terminal opposite the first side (e.g., the two sides may be a left and right side). The tap terminal described above may correspond to the first portion 220, third portion 222, and sub-portion 224a (e.g., recessed portion) of the external connection terminal, and the plating wire described above may correspond to the second sub-portion 224b (e.g., finger portion) of the external connection terminal.

The second end portion 224 may include a number of edges. For example, it may include edges 1-5 as shown in FIG. 2D. It may include other sized or shaped edges, such as shown for example in FIGS. 2A, 2C, 2D, 3A, 3B, 5A, 5B, and 9. Some of the edges may be linear edges, and other of the edges may be curved or may form an arc. In certain embodiments described herein, the second end portion 224 includes at least four linear edges. At least a first edge of the linear edges includes a shared edge shared with the middle portion of the first exposed external connection terminal (e.g., edge 1 shown in FIG. 2D is shared with edge e2 shown in FIG. 2C), and at least a second edge of the linear edges perpendicular to the first edge (e.g., edge 2 shown in FIG. 2D). At least a third edge of the linear edges may be oblique with respect to the first edge and the second edge (e.g., edge 5 shown in FIG. 2D), and may form the recessed portion 225 of the external connection terminal.

Thus, the printed circuit board for semiconductor module of the present disclosure may prevent a short circuit of the tap terminals, to thereby increase reliability.

Figure 3B:
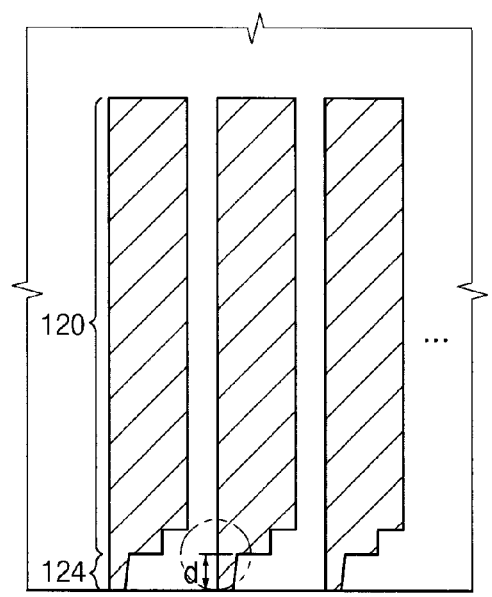

FIGS. 3A and 3B are plan views illustrating an exemplary tap terminal of a printed circuit board for semiconductor module according to modified embodiments.

In one embodiment, the tap terminals in FIGS. 3A and 3B are substantially the same as that in FIG. 2A except for shapes of the recessed portion.

Referring to FIG. 3A, the recessed portion of the tap terminal 120 may have a curved shape, such as an arc shape. As such, the edge that forms the recessed portion may be a curved edge.

Referring to FIG. 3B, the recessed portion of the tap terminal 120 may have a stepped shape. As such, the recessed portion may be formed with at least two linear edges.

Figure 4A:
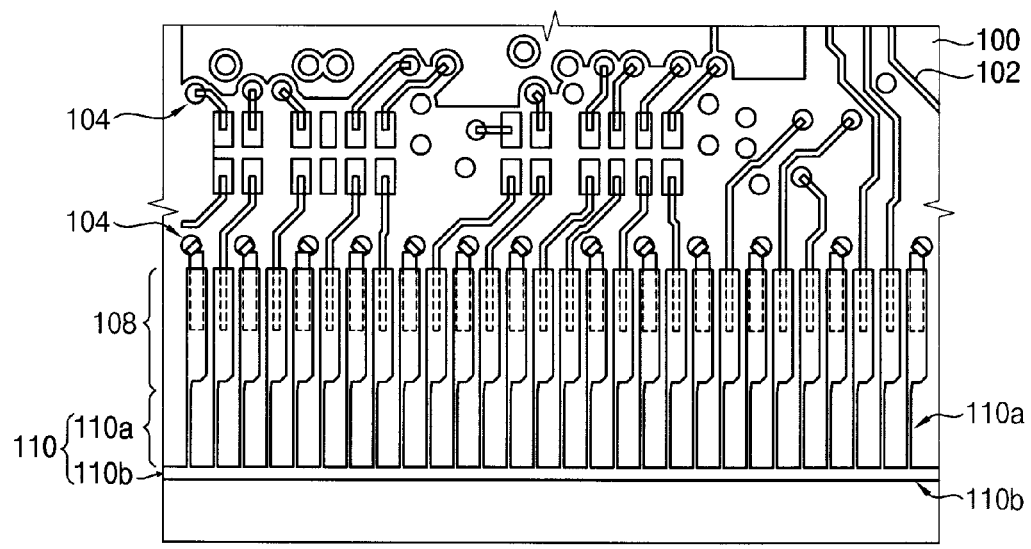
FIGS. 4A to 4C are plan views illustrating an exemplary method of manufacturing a printed circuit board for a semiconductor module such as shown in FIG. 2A.
Figure 4B:
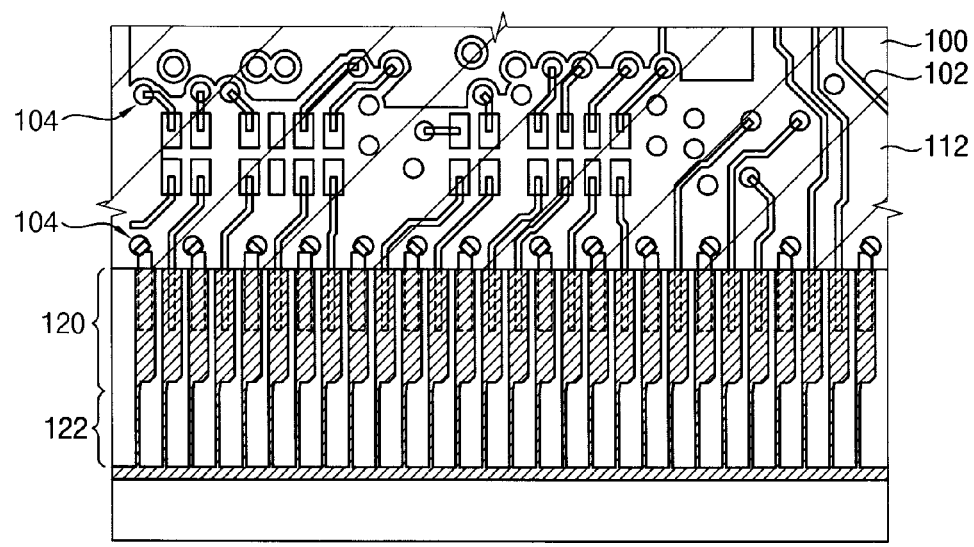
Figure 4C:
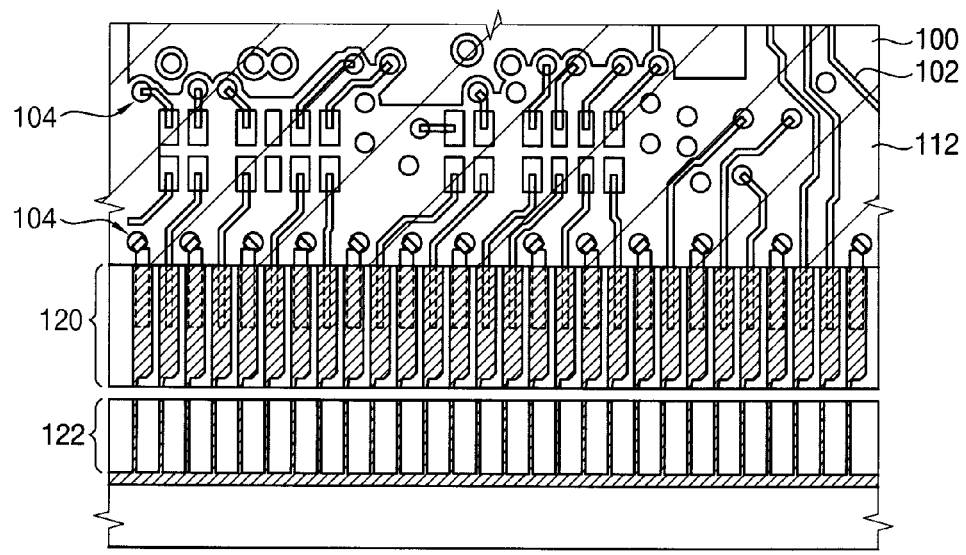

FIGS. 4A to 4C are plan views illustrating an exemplary method of manufacturing the printed circuit board a for semiconductor module such as shown in FIGS. 2A, 2C, and 2D.

Referring to FIG. 4A, a thin film including a conductive material (e.g., copper) may be formed on an insulation flat plate including an insulating material (e.g., phenol resin or epoxy resin) and may be etched to form circuit patterns for circuit wirings. The insulation flat plates may be stacked and then thermally treated and pressurized, to form a panel having a predetermined thickness. Following processes may be performed on the panel to form a plurality of printed circuit boards.

Then, a drilling process may be performed using mechanical drilling or laser drilling to form via holes in the panel. The via holes may be filled with a conductive material to form vias 104 that electrically connect a wiring pattern 102 formed in an outer layer and a wiring formed in an inner layer.

The wiring pattern 102 formed in the outer layer may include first and second patterns 108, 110 for a tap terminal and a plating wire. For example, the first and second patterns 108, 110 may include a conductive material such as copper. An electroplating process may be performed on the first pattern 108 to form a tap terminal 120. Accordingly, the first pattern 108 may have a shape the same as the tap terminal 120. In this embodiment, the first pattern 108 may have a shape the same as the tap terminal 120 in FIGS. 2A, 2C, and/or 2D. The second pattern 110 may be used to form the plating wire in FIGS. 2A, 2C, and/or 2D, however, the second pattern 110 may be formed to have a length greater than the plating wire in FIGS. 2A, 2C, and/or 2D. The second pattern 110 may include first lines 110a respectively connected to the first patterns 108 and a second line 110b connected to end portions of the first lines 110a.

Referring to FIG. 4B, a protecting layer pattern 112 may be formed on the wiring patterns 102. The protecting layer pattern 112 may be formed, for example, using solder resist or photo solder resist. An electroplating process may be not performed on the wiring patterns 102 that are covered with the protecting layer pattern 112.

An electroplating process may be performed using the second pattern 110 to form a conductive layer on the first and second patterns 108, 110. For example, a nickel layer and a gold layer may be sequentially formed on the first and second patterns 108, 110 to form a tap terminal 120 and a preliminary plating wire 122.

The above processes may be performed to form a plurality of printed circuit boards on the panel.

Referring to FIG. 4C, a router process may be performed to divide the panel into a respective printed circuit board. By performing a router process, the preliminary plating wire 122 may be cut to form a plating wire 124 in a peripheral region of a substrate body 100.

As a router process may be performed, the preliminary plating wire 122 having a line width smaller than a line width of the tap terminal 120 is cut. Accordingly, a router process may be easily performed on the plating wire.

Then, an inspecting process may be performed to select a good printed circuit board.

The above processes may be performed to form the printed circuit board in FIGS. 2A, 2C, and/or 2D. As mentioned above, even though the plating wire 124 is damaged in use, a short circuit of the adjacent tap terminals may be prevented.

FIG. 5A is a plan view illustrating a tap terminal of a printed circuit board for semiconductor module in accordance with a second example embodiment.

The printed circuit board for semiconductor module of the embodiment of FIG. 5A is substantially the same as in the embodiment of FIGS. 2-3, except for a tap terminal. Thus, the same reference numerals will be used to refer to the same or like elements as those described in connection with FIG. 2A, and any further repetitive explanation concerning the above elements will be omitted.

The printed circuit board for semiconductor module of the present embodiment may include a substrate body 100 having a circuit wiring layer and a tap terminal 134.

The substrate body 100 may be substantially the same as in the above embodiments.

Referring to FIG. 5A, a plurality of the tap terminal 134 may be provided on one or more surfaces (e.g., lower and upper surfaces) of the substrate body 100. The tap terminals 134 may be provided in a peripheral region of the substrate body 100.

The tap terminal 134 according to one embodiment may have three right angles. The tap terminal 134 may have two right angles in a portion opposite to an edge of the substrate body 100 and one right angle in a portion adjacent to the edge of the substrate body 100.

A side of the tap terminal 134 (e.g., s1) adjacent to the edge of the substrate body 100 may extend obliquely with respect to the edge of the substrate body 100 such that a line width of the tap terminal 134 decreases gradually toward the edge of the substrate body 100. That is, the side of the tap terminal 134 adjacent to the edge of the substrate body 100 may not be parallel with the edge of the substrate body 100.

The line width (d2) of the tap terminal 134 nearest the edge of the substrate body 100 may be determined such that a router process may be easily performed to cut a panel. For example, the line width (d2) of the tap terminal 134 nearest the edge of the substrate body 100 may be substantially the same as the line width of a general plating wire.

When the side of the tap terminal 134 has a large inclination with respect to the edge of the substrate body 100, the area substantially used for the tap terminal 134 may be decreased. One end of the side of the tap terminal 134 may be spaced apart from the edge of the substrate body 100 by the distance (d2) identical to the line width of a general plating wire. In this case, the area substantially used for the tap terminal may not be decreased.

In this embodiment, the portion of the printed circuit board facing the edge of the substrate body 100 may be the tap terminal 134, not the plating wire. Because the portion of the tap terminal 134 having a relatively smaller line width may be cut by a router process, a router process may be easily performed on the substrate body 100.

Further, the end portion of the tap terminal 134 adjacent to the edge of the substrate body 100 may have a line width greater than a general plating wire. Accordingly, the end portion of the tap terminal 134 may have a relatively greater strength. Therefore, the end portion of the tap terminal 134 may be prevented from being damaged by external physical impacts.

Figure 5B:
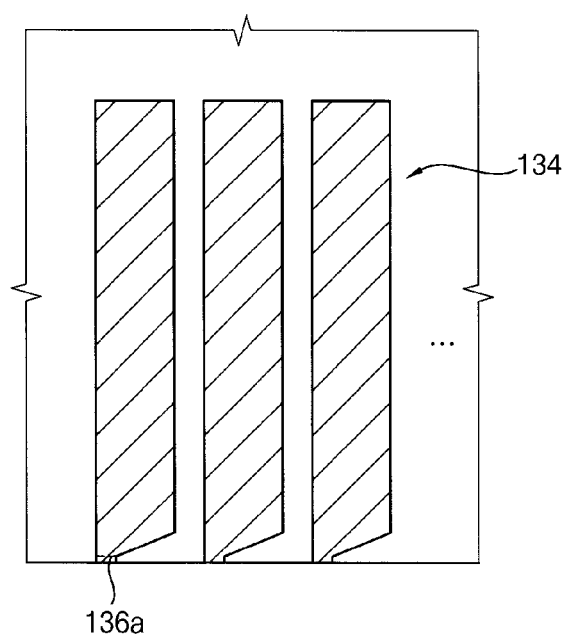
FIG. 5B is a plan view illustrating a tap terminal of a printed circuit board for semiconductor module according to a modified embodiment.

FIG. 5B is a plan view illustrating an exemplary tap terminal of a printed circuit board for semiconductor module according to a modified embodiment.

The tap terminal in FIG. 5B is substantially the same as that in FIG. 5A except that a plating wire 136a having a relatively smaller length is provided in an end portion of the tap terminal 134.

Referring to FIG. 5B, a routing process may be performed such that a portion of a preliminary plating wire remains to form a plating wire 136a having a relatively small length to be connected to the tap terminal 134. For example, the plating wire 136a may have a length smaller than half the vertical distance of the inclined side of the tap terminal 134.

Thus, the printed circuit board for semiconductor module in one embodiment may include the plating wire 136a having a relatively small length. Accordingly, even though the plating wire 136a is damaged, a short circuit of the adjacent tap terminals 134 may be prevented.

Figure 6A:
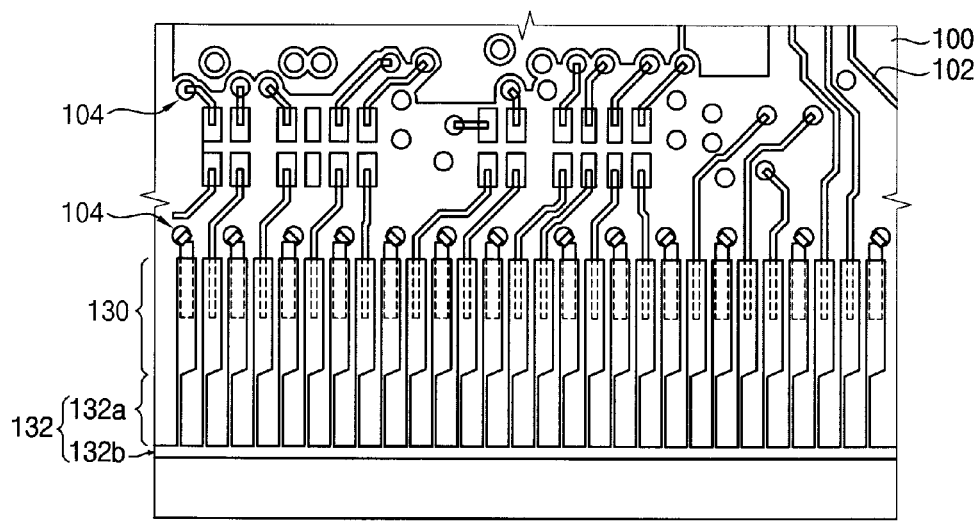
FIGS. 6A to 6C are plan views illustrating an exemplary method of manufacturing the printed circuit board for a semiconductor module such as shown in FIG. 2A.
Figure 6B:
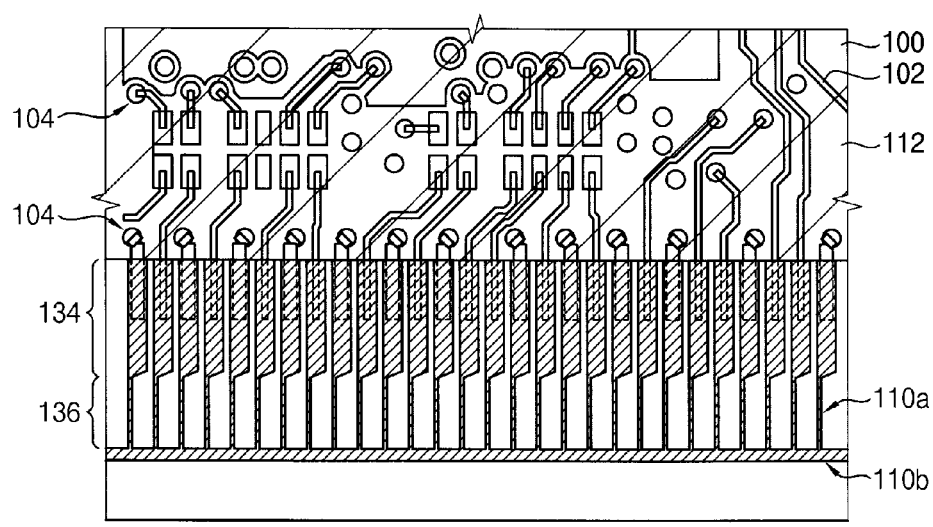
Figure 6C:
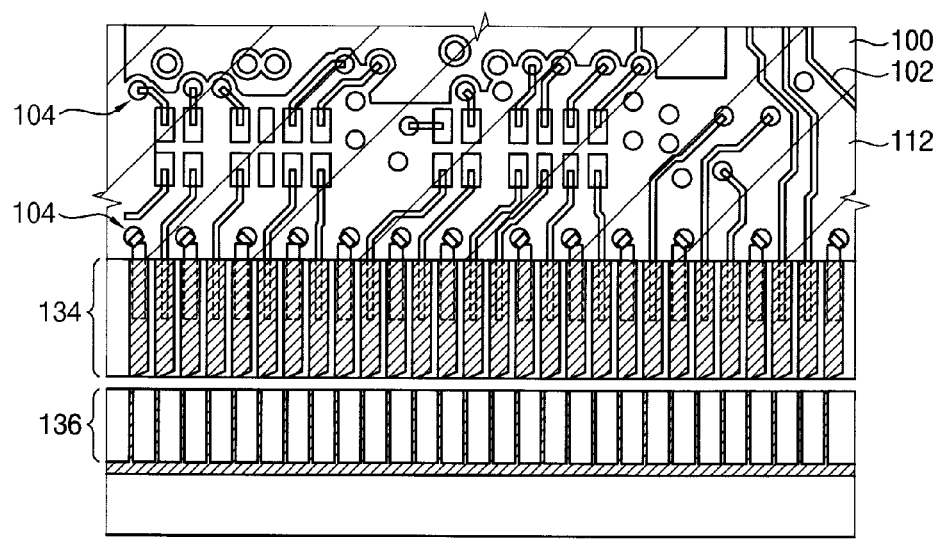

FIGS. 6A to 6C are plan views illustrating an exemplary method of manufacturing the printed circuit board for a semiconductor module such as shown in FIG. 5A or other figures.

Referring to FIG. 6A, the same processes as described with reference to FIG. 4A may be performed to form a panel including wiring patterns 102 formed on an outer layer. The wiring pattern 102 may include first and second patterns 130, 132 for forming a tap terminal and a preliminary plating wire. An electroplating process may be performed on the first pattern 130 to form a tap terminal. Accordingly, the first pattern 130 may have a shape the same as the tap terminal.

In one embodiment, the first pattern 130 may have a shape the same as the tap terminal 134 in FIG. 5A. The second pattern 132 may have a shape extending from an end portion of the first pattern 130 having a relatively small line width. As illustrated in the figure, the second pattern 132 may include first lines 132a extending from the first patterns 130 and a second line 132b connected to end portions of the first lines 132a.

Referring to FIG. 6B, a protecting layer pattern 112 may be formed on the wiring patterns 102.

An electroplating process may be performed using the second pattern 132 to form a conductive layer on the first and second patterns 130, 132. For example, a nickel layer and a gold layer may be sequentially formed on the first and second patterns 130, 132 to form a tap terminal 134 and a preliminary plating wire 136.

The above processes may be performed to form a plurality of printed circuit boards on the panel.

Referring to FIG. 6C, a router process may be performed to divide the panel into a respective printed circuit board. By performing a router process, the preliminary plating wire 136 may be completely removed to form only the tap terminal 134 in a peripheral region of a substrate body 100. Accordingly, the above processes may be performed to form the printed circuit board including the tap terminal in FIG. 5A.

Alternatively, a router process may be performed such that a portion of a preliminary plating wire remains to form the plating wire 136a having a relatively small length to be connected to the tap terminal 134. Accordingly, the printed circuit board including the tap terminal in FIG. 5B may be formed.

Then, an inspecting process may be performed to select a good printed circuit board.

As mentioned above, the end portion of the tap terminal may have a relatively greater width. Accordingly, the end portion of the tap terminal may be prevented from being damaged by external physical impacts in use.

Figure 7A:
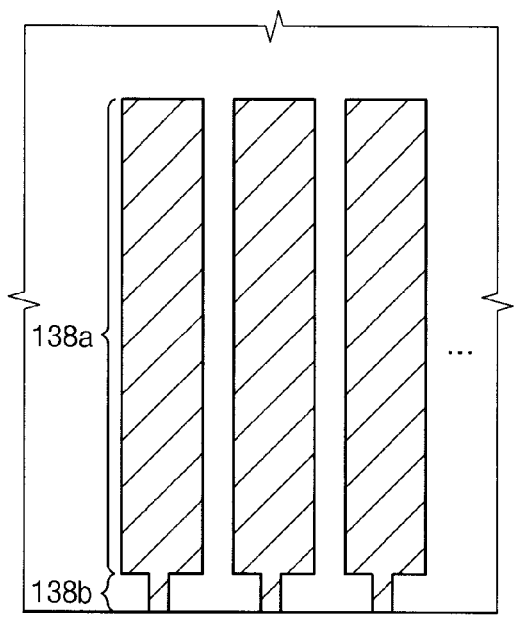
FIG. 7A is a plan view illustrating a tap terminal of a printed circuit board for a semiconductor module in accordance with an additional example embodiment.
Figure 7B:
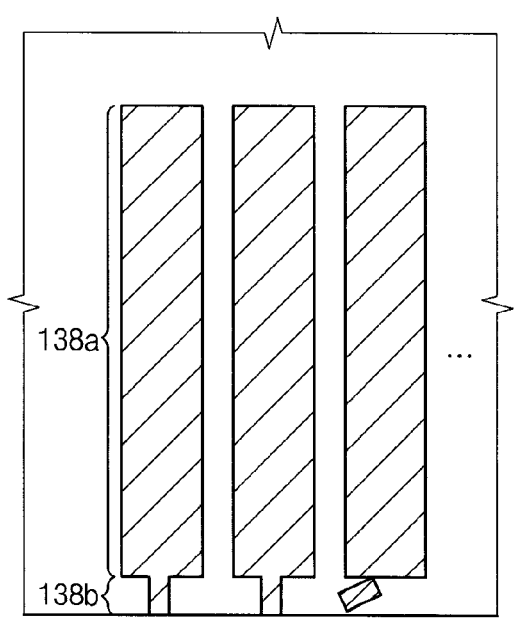
FIG. 7B shows that the plating wire in FIG. 7A is damaged.

FIG. 7A is a plan view illustrating a tap terminal of a printed circuit board for semiconductor module in accordance with a third example embodiment. FIG. 7B shows that the plating wire in FIG. 7A is damaged.

In the printed circuit board for semiconductor module of the embodiment of FIG. 7A, the same reference numerals will be used to refer to the same or like elements as those described in the previous embodiments, and any further repetitive explanation concerning the above elements will be omitted.

The printed circuit board for semiconductor module presenting one embodiment may include a substrate body 100 having a circuit wiring layer, a tap terminal 138a and a plating wire 138b.

The substrate body 100 may be substantially the same as in the above-described embodiments.

Referring to FIG. 7A, a plurality of the tap terminal 138a may be provided on one or more surfaces (e.g., lower and upper surfaces) of the substrate body 100. The tap terminal 138a may have a rectangular shape.

The plating wire 138b may extend from the middle portion of a side of the tap terminal 138a adjacent to an edge of the substrate body 100 to the edge of the substrate body 100. The plating wire 138b may have a line width smaller than a line width of the tap terminal 138a. The line width of the plating wire 138b may be uniform as the plating wire 138b extends to the edge of the substrate body 100. Alternatively, although it is not illustrated in the figure, the line width of the plating wire 138b may decrease as the plating wire 138b extends to the edge of the substrate body 100. As an example, a vertical side of the plating wire 138a may extend obliquely to the edge of the substrate body 100. As another example, both vertical sides of the plating wire 128a may extend obliquely to the edge of the substrate body 100.

The plating wire 138b and the tap terminal 138a may be formed by an electroplating process. The plating wire 138b and the tap terminal 138a may include nickel and gold. Accordingly, the plating wire 138b and the tap terminal 138a may have a low resistance.

In one embodiment, the plating wire 138b may have a shape protruding from the middle portion of the lower side of the tap terminal 138a. Accordingly, the plating wire 138b may be spaced apart from the adjacent tap terminal 138a by a sufficient distance.

Thus, as illustrated in FIG. 7B, even though the plating wire 138b is damaged and bent to move laterally, a short circuit of the adjacent tap terminals may be prevented.

A method of manufacturing the printed circuit board for semiconductor module in FIG. 7A may be substantially the same as described with reference to FIGS. 4A to 4C except for first and second patterns for forming a tap terminal and a plating wire.

In particular, processes the same as described with reference to FIG. 4A may be performed to form a panel including wiring patterns formed on an outer layer. The wiring pattern may include first and second patterns for forming a tap terminal and a preliminary plating wire. An electroplating process may be performed on the first pattern to form a tap terminal. Accordingly, the first pattern may have a shape the same as the tap terminal.

In one embodiment, the first pattern may have a shape the same as the tap terminal in FIG. 7A. The second pattern may be used to form the plating wire 138b in FIG. 7A, however, the second pattern may be formed to have a length greater than the plating wire 138b in FIG. 7A. The second pattern may include first lines extending from the first patterns and a second line connected to end portions of the first lines.

Then, the same processes as described with reference to FIGS. 4B and 4C may be performed to complete the printed circuit board for semiconductor module in FIG. 7A.

Accordingly, the plating wire may be spaced apart from the adjacent tap terminal by a sufficient distance, and thus, even though the plating wire is damaged, a short circuit of the adjacent tap terminals may be prevented.

FIG. 8A is a plan view illustrating a printed circuit board for semiconductor module in accordance with one example embodiment. FIG. 8B is a perspective view illustrating the printed circuit board for semiconductor module in FIG. 8A, according to one exemplary embodiment. FIG. 9 is a plan view illustrating a tap terminal of the printed circuit board for semiconductor module in FIG. 8A, according to one exemplary embodiment.

Referring to FIGS. 8A, 8B and 9, a printed circuit board for semiconductor module according to the one embodiment may include a substrate body 100 having a circuit wiring layer, a first tap terminal type 150, a second tap terminal type 154, a third tap terminal type 156, and first and second plating wires 152a, 158a.

The circuit wiring layer of the substrate body 100 may include a ground layer 100d, a power layer 100a, signal wiring layers 100b, 100c, etc. The ground layer 100d may be a bulk layer for receiving a ground signal. The power layer 100a may be a bulk layer for receiving a power signal. The signal wiring layer 100b, 100c may include wiring patterns. The above layers may be electrically connected to one another by vias 104 (e.g., through substrate vias).

The first tap terminal type 150 may be a signal terminal type through which external electrical signals are inputted/outputted to/from each of the wiring pattern. In one embodiment, a terminal having the first tap terminal type 150 may have a rectangular shape. However, the terminal may also have one of the shapes shown in FIGS. 2, 3 and 5.

The first plating wire 152a may extend from an end portion of a terminal having the first tap terminal 150 type to an edge of the substrate body 100. That is, the first plating wire 152a may have a shape protruding from one vertex portion of a first tap terminal (of the first tap terminal type 150) adjacent to the edge of the substrate body 100. The first plating wire 152a may have a line width smaller than a line width of the first tap terminal. An end portion of the first plating wire 152a connected to the first tap terminal may have a width smaller than that of the other portion of the plating wire 152a. That is, a lateral side of the first plating wire 152a may have a diagonal shape extending obliquely to the edge portion of the substrate body 100.

The second tap terminal type 154 may be a ground/power terminal type through which ground or power signals are inputted/outputted. The second tap terminal type 154 may not be connected to the wiring pattern formed in an outer layer. The second tap terminal type 154 may be electrically connected to the ground layer and the power layer through the via 104. Accordingly, an electrical signal may be applied to the ground layer 100d and the power layer 100a through the second tap terminal type 154, respectively.

In one embodiment, a second tap terminal having the second tap terminal type 154 may have a rectangular shape. The second tap terminal may not be connected to a plating wire. The second tap terminal may be arranged between terminals having the first tap terminals type 150. Terminals having the second tap terminal type 154 may be arranged in series and/or terminals having the first tap terminal type 150 may be arranged in series.

Terminals having the second tap terminal type 154 may have a length smaller than that of the first tap terminal types 150. For example, terminals having the first tap terminal type 150 may be spaced apart from the edge of the substrate body by a first distance (a). Terminals having the second tap terminal type 154 may be spaced apart from the edge of the substrate body by a second distance (b) greater than the first distance (a).

A second terminal having the second tap terminal type 154 that is adjacent to a first terminal having the first tap terminal type 150 may not be positioned within a circle having a length (d) of the first plating wire 152a from the vertex portion of the adjacent first tap terminal from which the first plating wire 152a protrudes. Accordingly, the second distance (b) of the second tap terminal may be determined in consideration of the length of the first plating wire. For example, the difference between the second distance (b) and the first distance (a) may be greater than the length (d) of the first plating wire. The distance (b) may be at least two times the distance (d).

The third tap terminal type 156 may be provided to allow current to flow through the second tap terminal 154 while an electroplating process is performed. The third tap terminal type 156 may include at least one terminal connected to the ground layer and at least one terminal connected to the power layer. Terminals having the third tap terminal type 156 may have the same shape as terminals having the first tap terminal type 150.

The second plating wire 158a may extend from an end portion of the third tap terminal types 156 to an edge of the substrate body 100. That is, the second plating wire 158a may have the same shape as the first plating wire 152a.

In one embodiment, the second tap terminal type terminals 154 may be farther away from the edge of the substrate body than the first tap terminal type terminals 150. The second tap terminal types 154 may not include a plating wire. Accordingly, a distance between vertices of the adjacent first and second tap terminals having types 150 and 154 may be increased. Therefore, even though the first plating wire 152a of the first tap terminal type 150 is damaged and bent to move laterally, a short circuit of the adjacent first and second tap terminals having types 150 and 154 may be prevented.

Figure 10A:
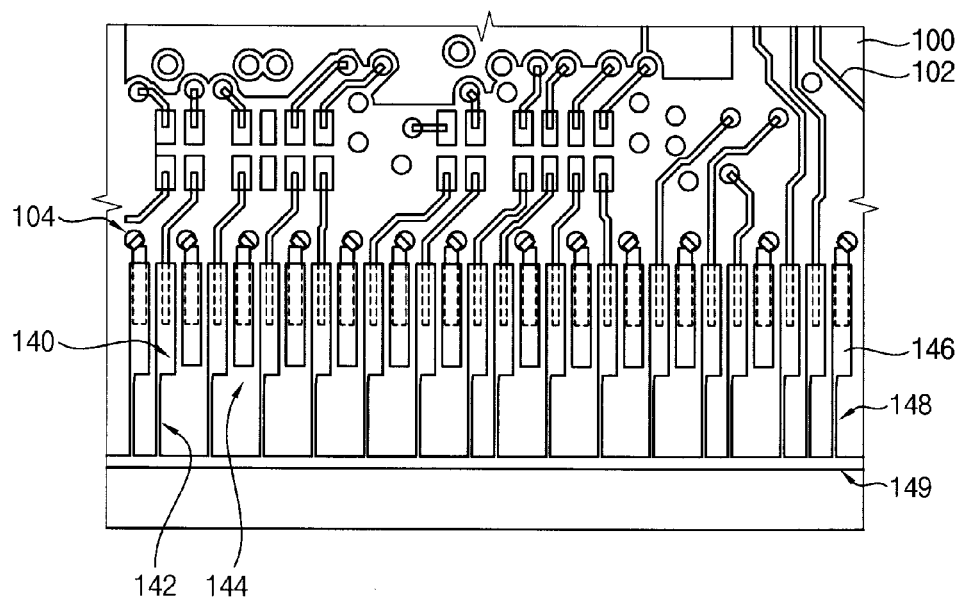
Figure 10B:
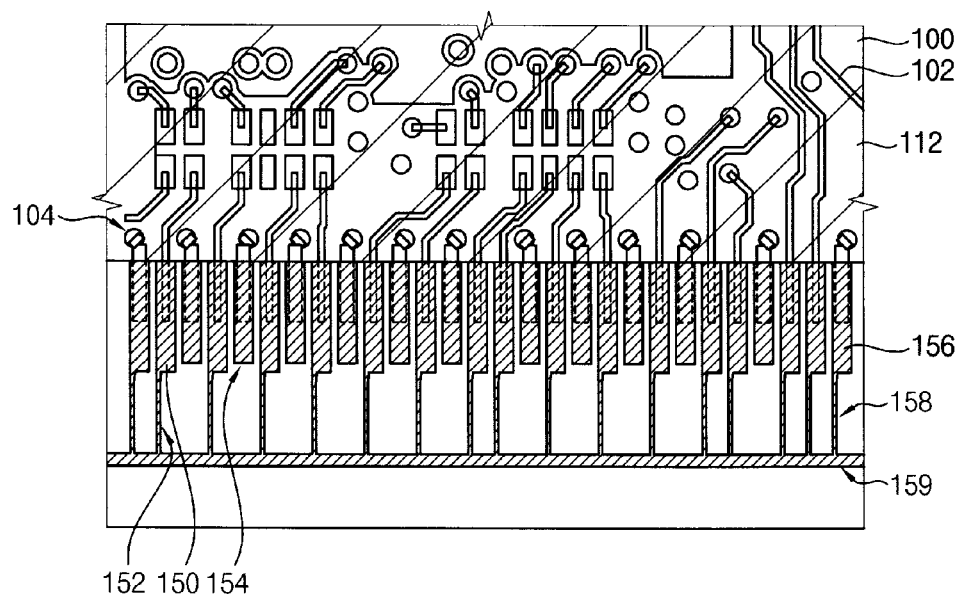
Figure 10C:
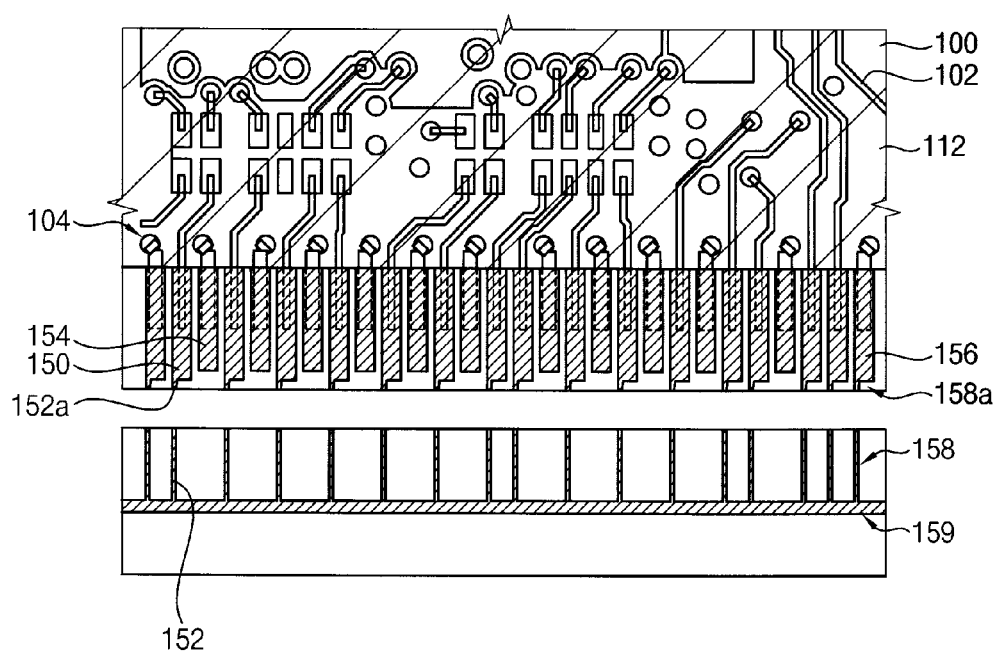

FIGS. 10A to 10C are plan views illustrating an exemplary method of manufacturing the printed circuit board for a semiconductor module such as shown in FIG. 8A.

Referring to FIG. 10A, the same processes as described with reference to FIG. 4A may be performed to form a panel including wiring patterns 102 formed on an outer layer.

The wiring pattern 102 may include first and second patterns 140, 142 for forming a first type tap terminal and a first preliminary plating wire, and third patterns 144 for forming a second type tap terminal. The wiring pattern 102 may include fourth and fifth pattern 146, 148 for forming a third type tap terminal and a second preliminary plating wire. The second and fifth patterns 142, 148 for forming the first and second preliminary plating wire may include a connection line 149 connected to end portions thereof.

The first and second patterns 140, 142 may be connected to circuit patterns by wiring lines. The third pattern 144 may be electrically connected to a ground layer or a power layer by a via 104. Some of the fourth and fifth patterns 146, 148 may be electrically connected to the ground layer and others of the fourth and fifth patterns 146, 148 may be electrically connected to the power layer.

Referring to FIG. 10b, a protecting layer pattern 112 may be formed on the wiring patterns 102.

An electroplating process may be performed using the second and fifth patterns 142, 148 and the connection line 149 to form a conductive layer on the first to fifth patterns and the connection line 149. For example, a nickel layer and a gold layer may be sequentially formed on the first to fifth patterns to form terminals having first to third tap terminal types 150, 154, 156 and first and second preliminary plating wires 152, 158. As mentioned above, when current is applied to the fifth pattern 148, current may flow through the third pattern 144 through the ground layer or the power layer. Therefore, even though the third pattern 144 is not connected to a preliminary plating wire, an electroplating process may be performed to form a conductive layer on the third pattern 144.

The above processes may be performed to form a plurality of printed circuit boards on the panel.

Referring to FIG. 10C, a router process may be performed to divide the panel into a respective printed circuit board. By performing a router process, the first and second preliminary plating wire 152, 158 may be cut to form first and second plating wires 152a, 158a adjacent to an edge of a substrate body 100.

As mentioned above, because the second tap terminal type 154 does not include a preliminary plating wire, the number of the preliminary plating wires to be cut by a router process may be decreased. Accordingly, a router process may be easily performed on the plating wire.

Then, an inspecting process may be performed to select a good printed circuit board.

The above processes may be performed to complete the printed circuit board for a semiconductor module, for example, shown in FIG. 8A. As mentioned above, even though the plating wire is damaged in use, a short circuit of the adjacent tap terminals may be prevented.

As illustrated in the figures, devices such as DRAM or other devices may be mounted on the printed circuit board according to example embodiments to form, for example, a DRAM module, to thereby prevent a short circuit of tap terminals. Other types of memory devices or logic devices may also be used with the disclosed PCB to implement the features of the disclosed embodiments. For examples semiconductor packages including one or more stacked chips may be formed on a PCB such as described in the embodiments above. The terminals described above as signal terminals may include data signals, command signals, or address signals. As such, the PCB may be used to form modules including memory and/or logic devices.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present disclosure. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A printed circuit board (PCB) comprising:
   a substrate body including a wiring pattern at a wiring pattern region of the substrate body;
   an outer connection region extending from the wiring pattern region to an edge of the substrate body, the outer connection region including a plurality of exposed external connection terminals; and
   at least a first exposed external connection terminal electrically connected to the wiring pattern and a second exposed external connection terminal electrically connected to the wiring pattern and adjacent to the first exposed external connection terminal, wherein:
   the first exposed external connection terminal includes, when viewed from a plan view, a first outer-most edge, a second outer-most edge connected to the first outer-most edge, a third outer-most edge opposite the first outer-most edge, a fourth outer-most edge opposite the second outer-most edge, and an additional edge, wherein the third outer-most edge and the additional edge both face the edge of the substrate body, the second outer-most edge extends a distance d between a point where it intersects a line extending from the additional edge in the direction of the additional edge and a point where it intersects the third outer-most edge, and the second exposed external connection terminal includes a fifth outer-most edge facing the second outer-most edge, and the second exposed external connection terminal is not formed in a circular region having a radius d and a center located on the second outer-most edge a distance d away from the third outer-most edge.

2. The PCB of claim 1, wherein the first exposed external terminal further comprises:
an oblique edge extending between the additional edge and the fourth outer-most edge.

3. The PCB of claim 1, wherein the first exposed external terminal further comprises:
a curved edge extending between the additional edge and the fourth outer-most edge.

4. The PCB of claim 1, wherein:
the first through fourth outer-most edges and the additional edge are linear edges,
the third outer-most edge is parallel to the additional edge, and
the first exposed external terminal further includes an oblique edge extending between the additional edge and the fourth outer-most edge.

5. The PCB of claim 1, wherein:
the second outer-most edge and fourth outer-most edge are parallel to each other and are perpendicular to the first outer-most edge.

6. The PCB of claim 5, wherein:
the third outer-most edge is parallel to the first outer-most edge and to the additional edge.

7. The PCB of claim 1, wherein:
the additional edge is an oblique edge extending between the third outer-most edge and the fourth outer-most edge.

8. The PCB of claim 1, wherein:
the second exposed external connection terminal has the same shape as the first exposed external connection terminal, when viewed from plan view.

9. The PCB of claim 8, wherein:
the first exposed external connection terminal is a signal terminal, and second exposed external connection terminal is a power or ground terminal.

10. The PCB of claim 8, wherein:
when viewed from a plan view, the first outer-most edge is a top-most edge, the third outer-most edge is a bottom-most edge, the second outer-most edge is one of a right-most edge and a left-most edge, and the fourth outer-most edge is the other of a right-most edge and a left-most edge.

11. The PCB of claim 1, wherein:
the third outer-most edge is bottom-most edge,
the second exposed external connection terminal has bottom-most edge parallel to the third bottom-most edge, and
the bottom-most edge of second exposed external connection terminal is a distance of at least 2 d away from a line extended along the direction of the third outer-most edge.

12. The PCB of claim 11, wherein:
the second exposed external connection terminal is a power/ground terminal, and the first exposed external connection terminal is a signal terminal.

13. A printed circuit board (PCB) comprising:
a substrate body including a wiring pattern at a wiring pattern region of the substrate body;
an outer connection region extending from the wiring pattern region to an edge of the substrate body, the outer connection region including a plurality of exposed external connection terminals; and
at least a first exposed external connection terminal electrically connected to the wiring pattern and a second exposed external connection terminal electrically connected to the wiring pattern and adjacent to the first exposed external connection terminal;
wherein the first exposed external connection terminal includes a first end portion that connects to a wiring of the wiring pattern, a second end portion opposite the first end portion and extending to the edge of the substrate body, and a middle portion between the first end portion and the second end portion;
wherein the second end portion includes a recessed portion having a recess on a first side of the first exposed external connection terminal and a finger portion having a finger on a second side of the first exposed external connection terminal opposite the first side, and
wherein the second end portion includes at least four linear edges, at least a first edge of the linear edges including a shared edge shared with the middle portion of the first exposed external connection terminal, and at least a second edge of the linear edges perpendicular to the first edge.

14. The PCB of claim 13, wherein:
at least a third edge of the linear edges is oblique with respect to the first edge and the second edge.

15. The PCB of claim 13, wherein:
the first exposed external connection terminal is formed of a conductive plating.

16. The PCB of claim 13, wherein:
the third edge forms the recessed portion of the second end portion.

17. The PCB of claim 13, wherein:
the first edge extends a distance d beyond the recessed portion; and
the second exposed external connection terminal includes an edge facing the first edge, and the second exposed external connection terminal is not formed in a circular region having a radius d and a center located on the first edge a distance d away from the edge of the substrate body.

18. A printed circuit board (PCB), comprising:
a substrate body including a circuit wiring layer;
tap terminals provided at a surface of the substrate body and in a peripheral region of the substrate body and electrically connected to the circuit wiring layer; and
plating wires corresponding to respective tap terminals, each plating wire extending from an end portion of its respective tap terminal toward an edge of the substrate body and having a line width smaller than a line width of the tap terminal,
wherein for at least a first tap terminal, the tap terminal shares an edge with an edge of its respective plating wire, and
wherein a second tap terminal adjacent the first tap terminal is positioned outside a circle having a radius that equals a length of the plating wire and having a center at a point along the shared edge where the plating wire and first tap terminal connect.

19. The PCB for semiconductor module of claim 18, wherein the first tap terminal comprises a recessed portion at a side of the first tap terminal opposite the shared edge.

20. The PCB for semiconductor module of claim 19, wherein the recessed portion of the tap terminal has an oblique side shape, an arc shape or a stepped shape.

* * * * *